United States Patent
Yoo et al.

(10) Patent No.: US 7,563,677 B2
(45) Date of Patent: Jul. 21, 2009

(54) RECESSED GATE ELECTRODE AND METHOD OF FORMING THE SAME AND SEMICONDUCTOR DEVICE HAVING THE RECESSED GATE ELECTRODE AND METHOD OF MANUFACTURING THE SAME

(75) Inventors: Dae-Han Yoo, Seoul (KR); Kong-Soo Lee, Gyeonggi-do (KR); Chang-Hoon Lee, Seoul (KR); Yong-Woo Hyung, Gyeonggi-do (KR); Hyeon-Deok Lee, Seoul (KR); Hyo-Jung Kim, Gyeonggi-do (KR); Jung-Hwan Oh, Gyeonggi-do (KR); Young-Sub You, Gyeonggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 351 days.

(21) Appl. No.: 11/531,239

(22) Filed: Sep. 12, 2006

(65) Prior Publication Data

US 2007/0059889 A1    Mar. 15, 2007

(30) Foreign Application Priority Data

Sep. 12, 2005    (KR) .................. 10-2005-0084761

(51) Int. Cl.
 *H01L 21/336* (2006.01)
(52) U.S. Cl. .................. 438/259; 438/270; 438/282; 257/E21.429; 257/E21.655

(58) Field of Classification Search .................. 438/259, 438/270, 282, 300, 153; 257/288, 330, 413
See application file for complete search history.

(56) References Cited

U.S. PATENT DOCUMENTS 6,020,610 A * 2/2000 Ueno et al. .................. 257/315

(Continued)

FOREIGN PATENT DOCUMENTS

JP    10-233451    9/1998

(Continued)

OTHER PUBLICATIONS

English language abstract of Japanese Publication No. 10-233451.

(Continued)

*Primary Examiner*—Thanh V Pham
*Assistant Examiner*—Duy T Nguyen
(74) *Attorney, Agent, or Firm*—Marger Johnson & McCollom, P.C.

(57) ABSTRACT

A recessed gate electrode structure includes a first recess and a second recess in communication with the first recess both formed in a substrate. The second recess is larger than the first recess. A gate dielectric layer is formed on a top surface of the substrate and on an inner surface of the first and second recesses. A first polysilicon layer fills the first recess and is doped with impurities at a first impurity density. A second polysilicon layer fills the second recess and is doped with the impurities at a second impurity density. A void is defined within the second polysilicon layer. A third polysilicon layer is formed on the gate dielectric and first polysilicon layers and is doped with the impurities at a third impurity density. Due to impurities in the second polysilicon layer, migration of the void within the second recess may be substantially prevented.

8 Claims, 13 Drawing Sheets

U.S. PATENT DOCUMENTS

| | | | |
|---|---|---|---|
| 6,171,954 | B1 | 1/2001 | Hsu |
| 6,200,851 | B1 * | 3/2001 | Arnold ..................... 438/243 |
| 6,215,149 | B1 * | 4/2001 | Lee et al. .................... 257/328 |
| 6,262,449 | B1 * | 7/2001 | Lu et al. ..................... 257/303 |
| 6,307,236 | B1 * | 10/2001 | Matsuzaki et al. .......... 257/392 |
| 6,319,788 | B1 * | 11/2001 | Gruening et al. ............ 438/386 |
| 6,440,792 | B1 * | 8/2002 | Shiao et al. ................. 438/243 |
| 6,537,860 | B2 * | 3/2003 | Akiyama et al. ............ 438/135 |
| 6,762,098 | B2 | 7/2004 | Hshieh et al. |
| 6,939,765 | B2 * | 9/2005 | Kim et al. ................... 438/259 |
| 2004/0018696 | A1 * | 1/2004 | Wieczorek et al. ......... 438/431 |
| 2005/0014338 | A1 | 1/2005 | Kim et al. |

FOREIGN PATENT DOCUMENTS

| | | |
|---|---|---|
| JP | 11-177089 | 7/1999 |
| JP | 2000-349289 | 12/2000 |
| KR | 1998-064222 | 10/1998 |
| KR | 10-0236048 | 9/1999 |
| KR | 2000-0060693 | 10/2000 |
| KR | 10-0304717 | 7/2001 |
| KR | 10-2004-0054248 | 6/2004 |
| KR | 10-2005-0007637 | 1/2005 |

OTHER PUBLICATIONS

English language abstract of Japanese Publication No. 11-177089.
English language abstract of Korean Publication No. 10-0236048.
English language abstract of Japanese Publication No. 2000-349289.
English language abstract of Korean Publication No. 10-0304717.
Englsih language abstract of Korean Publication No. 10-2004-0054248.
English language abstract of Korean Publication No. 10-2005-0007637.

* cited by examiner

RECESSED GATE ELECTRODE AND METHOD OF FORMING THE SAME AND SEMICONDUCTOR DEVICE HAVING THE RECESSED GATE ELECTRODE AND METHOD OF MANUFACTURING THE SAME

CROSS-REFERENCE TO RELATED APPLICATIONS

This application claims priority from Korean Patent Application No. 10-2005-0084761, filed on 12 Sep. 2005. Korean Patent Application No. 10-2005-0084761 is incorporated by reference in its entirety.

BACKGROUND

1. Technical Field

This disclosure relates to a recessed gate structure and a method of forming the same. This disclosure also relates to a semiconductor device having such a recessed gate structure and to a method of manufacturing the same.

2. Description of the Related Art

As integration within semiconductor devices becomes more highly integrated, line widths and line intervals of patterns on semiconductor substrates have decreased resulting in increasingly fine patterns. Thus, techniques have evolved to accurately and precisely form fine patterns on substrates. One such technique involves the formation of recessed electrodes that occupy minimal area on the substrate and have sufficient effective channel length. Such recessed electrodes have been used as gate electrodes of semiconductor devices. Exemplary semiconductor devices incorporating recessed gate electrodes have been disclosed in Korean Patent No. 304,717, U.S. Pat. No. 6,762,098, and Japanese Patent Laid-Open Publication No. 2000-349289.

Generally, recessed gate electrodes are formed by creating a recess within a substrate and filling the recess with conductive material. The recess typically includes an upper portion and a lower portion that has a larger maximum diameter than the upper portion. Accordingly, the upper portion of the recess can become clogged with the conductive material before the recess itself is completely filled. As a result, a void is often defined within a central region of the conductive material present in the lower portion of the recess.

Metal-oxide semiconductor (MOS) transistors incorporating recessed gate electrodes are generally not adversely influenced by voids centrally located within the lower portion of a recess. However, voids of recessed gate electrodes can migrate easily due to silicon diffusion facilitated during subsequent processes. When such voids migrate, electrical characteristics of the MOS transistors can deteriorate.

FIG. 1 illustrates a cross-sectional view of a recessed gate electrode having a void that has migrated from a central region of conductive material present in the lower portion of a recess to a peripheral region thereof.

Referring to FIG. 1, a recess is formed in a substrate 10, a gate oxide layer 12 is formed over the top surface of the substrate 10 and along inner surfaces of a recess formed in the substrate 10 and conductive material 16 (i.e., the recessed gate electrode) is formed over the gate oxide layer 12 and into the recess. Due to the internal geometry of the recess, the upper portion of the recess becomes clogged, leaving a void 14 defined within a central region of the conductive material in the lower portion of the recess. During subsequent processes, the void 14 can migrate from the central region to a peripheral portion thereof (as shown in the figure) and contact a gate oxide layer 12. When the void 14 contacts the gate oxide layer 12, a leakage current is generated while a threshold voltage of the MOS transistor deviates from a preset value and irregularly fluctuates. The existence of such leakage current and threshold voltage fluctuation deteriorate the electrical characteristics of any MOS transistor that is subsequently formed using the recessed gate electrode.

SUMMARY

Embodiments exemplarily described herein provide a recessed gate electrode in which void migration is minimized and a method of forming the same. Other embodiments exemplarily described herein provide a semiconductor device having such a recessed gate electrode and a method of manufacturing the same.

BRIEF DESCRIPTION OF THE DRAWINGS

The above and other features and advantages of the invention will become more apparent by describing in detail exemplary embodiments with reference to the accompanying drawings, in which.

DETAILED DESCRIPTION

Figure 1:
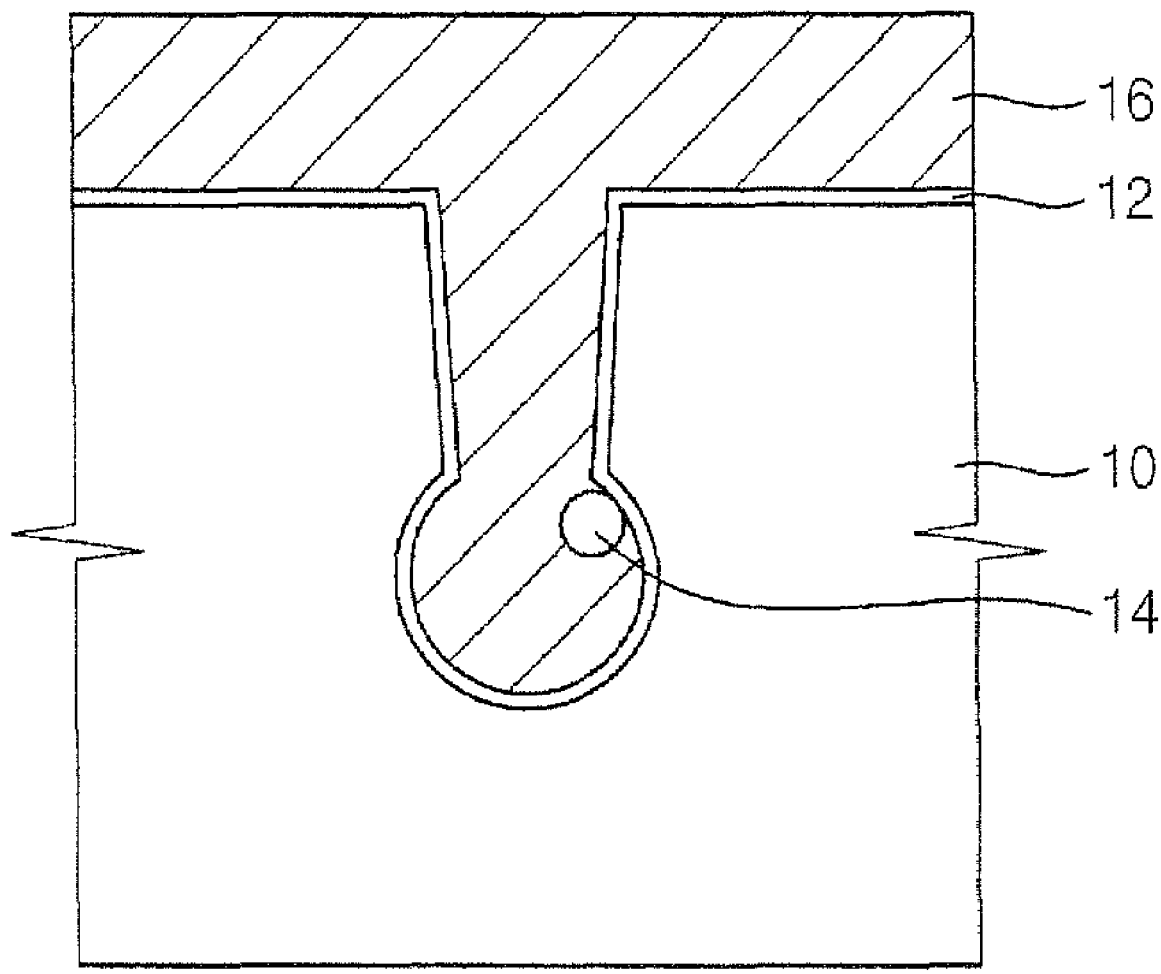
FIG. 1 illustrates a cross-sectional view of a recessed gate electrode having a void that has migrated from a central region to a peripheral region thereof.

The invention is described more fully hereinafter with reference to the accompanying drawings, in which example embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the invention.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Exemplary embodiments of the invention are described herein with reference to cross-sectional illustrations that are schematic illustrations of idealized example embodiments (and intermediate structures) of the invention. As such, variations from the shapes of the illustrations as a result, for example, of manufacturing techniques and/or tolerances, are to be expected. Thus, exemplary embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
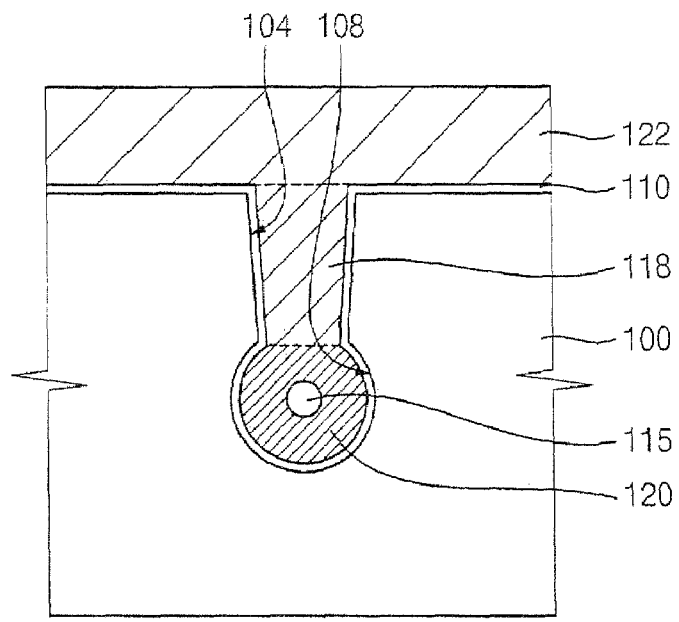
FIG. 2 illustrates a cross-sectional view of a recessed gate electrode layer in accordance with one embodiment.

FIG. 2 illustrates a cross-sectional view of a recessed gate electrode layer in accordance with one embodiment.

Referring to FIG. 2, a first recess 104 and a second recess 108 in communication with the first recess 104, are formed within a substrate 100 (e.g., a silicon wafer). The second recess 108 is larger than the first recess 104 in that a maximum diameter of the second recess 108 is larger than a maximum diameter of the first recess 104. In one embodiment, a sidewall of the first recess 104 is inclined slightly with respect to the top surface of the substrate 100. In another embodiment, the sidewall of the first recess 104 is substantially perpendicular to the top surface of the substrate 100. The cross-section of the second recess 108 is curved (e.g., to resemble a circle or an ellipse).

A gate dielectric layer such as a gate oxide layer 110 is formed on the top surface of the substrate 100 and on sidewalls of the first and second recesses 104 and 108 (i.e., inner surface of the first and second recesses 104 and 108). The gate oxide layer 110 may include silicon oxide or a metal oxide having a dielectric constant higher than that of silicon oxide.

A first polysilicon layer 118 is formed in the first recess 104 and a second polysilicon layer 120 is formed in the second recess 108. In one embodiment, the first polysilicon layer 118 is doped with impurities at a first impurity density and the second polysilicon layer 120 is doped with impurities at a second impurity density higher than the first impurity density. Due to the presence of such impurities, the first and second polysilicon layers 118 and 120 are rendered electrically conductive. In another embodiment, the impurities in the first and second polysilicon layers 118 and 120 are of the same conductivity-type (i.e., impurities in the first and second polysilicon layers 118 and 120 have the same electrical polarity). In another embodiment, impurities in the first and second polysilicon layers 118 and 120 are the same.

A void 115 is defined at a substantially central region of the second polysilicon layer 120. In one embodiment, impurities within the second polysilicon layer 120 help to prevent the void 115 from migrating within the second polysilicon layer 120. When impurities are present within the second polysilicon layer 120 at the second impurity density, the void is prevented from migrating within the second silicon layer 120.

Void migration within the second polysilicon layer 120 is presently understood to be caused by silicon diffusion. Lattice defects are generated around the void 115 in the second polysilicon layer 120 and, when external environmental conditions such as heat are varied, silicon atoms around the void 115 are capable of diffusing in all directions due to the lattice defects. When impurities are doped into the second polysilicon layer 120 at the second impurity density, the silicon atoms collide with the impurities and are prevented from diffusing. Thus, when silicon atoms around the void 115 are prevented from diffusing, void migration can also be substantially prevented. Because void migration within the second polysilicon layer 120 can be substantially prevented, the void 115 can be prevented from contacting the gate oxide layer 110, thereby reducing leakage current and fluctuation of threshold voltage in a metal-oxide semiconductor (MOS) transistor subsequently formed from the recessed gate electrode.

In one embodiment, void migration within the second polysilicon layer 120 may be substantially prevented by doping the second polysilicon layer 120 with phosphorus (P) impurities at a second impurity density ranging from about 2.5E20 atoms/cm$^3$ and about 5E20 atoms/cm$^3$ (e.g., from about 3.5E20 atoms/cm$^3$ to about 5E20 atoms/cm$^3$). It will be appreciated, however, that the second impurity density in the second polysilicon layer 120 may vary in accordance with, for example, the kind of impurity used, the sizes of the first and second recesses 104 and 108, and the size of the void 115.

Voids are rarely generated within the first polysilicon layer 118 because the first recess 104 is smaller than the second recess 108. As a result, void migration in the first polysilicon layer 118 is not as problematic as in the second polysilicon layer 120. Consequently, the first polysilicon layer 118 may be doped with impurities at the first impurity density. For example, the first polysilicon layer may be doped with phosphorus (P) impurities at a first impurity density ranging from about 2.5E20 atoms/cm$^3$ to about 3.5E20 atoms/cm$^3$.

A third polysilicon layer 122 is formed on the gate oxide layer 110 and on the first polysilicon layer 118. The third polysilicon layer 122 is doped with impurities at a third impurity density. In one embodiment, impurities doped into the third polysilicon layer 122 are the same conductivity-type as impurities doped into the first and second polysilicon layer 118 and 120. In another embodiment, impurities doped into the third polysilicon layer 122 are the same impurities that are doped into the first and second polysilicon layer 118 and 120. In another embodiment, the third impurity density is lower than the first impurity density. For example, the third impurity density may range from about 1.5E20 atoms/cm$^3$ to about 2.3E20 atoms/cm$^3$.

Electrical characteristics of recessed transistors (i.e., transistors formed from recessed gate electrodes) are different from those of planar transistors (i.e., transistors formed from gate electrodes formed on the surface of the substrate 100). As described above, the second impurity density is higher than the first or third impurity densities and the third impurity density is less than the first impurity density. Accordingly, a recessed transistor may be formed at one region of the substrate 100 using a recessed gate electrode exemplarily described herein while a planar transistor may be formed on another portion of the substrate 100.

FIGS. 3 to 8 are sectional diagrams illustrating a method of forming the recessed gate electrode layer shown in FIG. 2.

Figure 3:
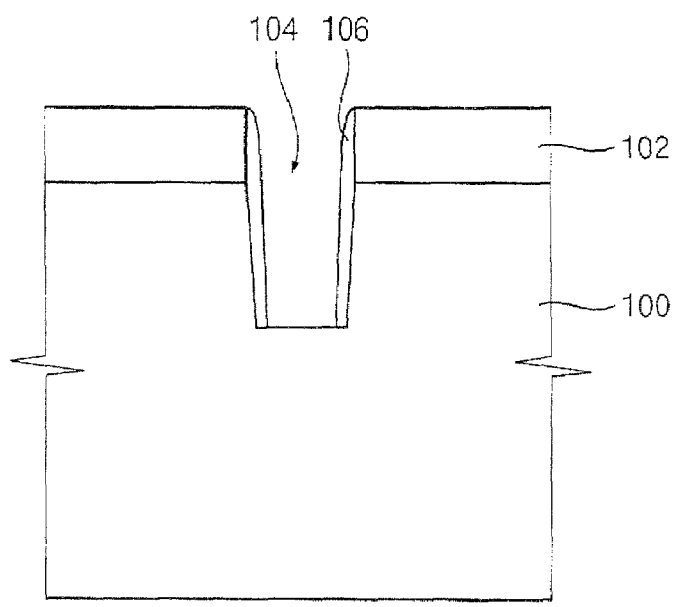
FIGS. 3 to 8 are sectional diagrams illustrating a method of forming the recessed gate electrode layer shown in FIG. 2.

Referring to FIG. 3, a buffer oxide layer (not shown) and a first mask layer (not shown) are formed on a semiconductor substrate 100 (e.g., a silicon wafer). In one embodiment, the buffer oxide layer includes a silicon oxide layer formed by a thermal oxidation process, and the first mask layer includes a silicon nitride layer. The first mask layer and the buffer oxide layer are patterned via a photolithography process, thereby forming a first mask pattern 102 on the substrate 100.

Next, the substrate 100 is anisotropically etched using the first mask pattern 102 as an etching mask to form a first recess 104. In one embodiment, a sidewall of the first recess 104 is inclined slightly with respect to a top surface of the substrate 100. In another embodiment, the sidewall of the first recess 104 is substantially perpendicular to the top surface of the substrate 100.

After the first recess 104 is formed, a second mask layer (not shown) is formed on the first mask pattern 102 and on the sidewall and a bottom surface of the first recess 104. The second mask layer is formed of a material capable of being etched selectively with respect to the substrate 100 so that the amount that the substrate 100 etched is minimal when the second mask layer is etched. In one exemplary embodiment, the second mask layer may include the same material as the first mask pattern 102.

Portions of the second mask layer are removed from the first mask pattern 102 and the bottom surface of the first recess 104 in an anisotropic etching process that leaves the portions of the second mask layer remaining only on the sidewall of the first recess 104. As a result of the anisotropic etching process, a second mask pattern 106 is formed on the sidewall of the first recess 104.

Figure 4:
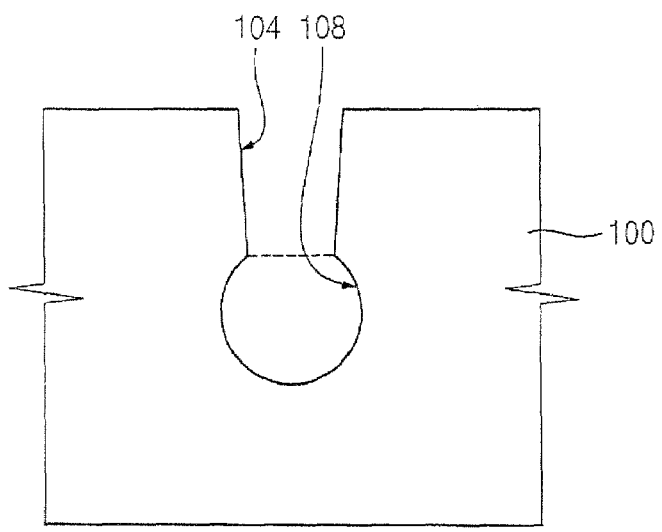

Referring to FIG. 4, the bottom surface of the first recess 104 is etched using the first and second mask patterns 102 and 106 as an etching mask. As a result, a second recess 108 is formed beneath the first recess 102 and communicates with the first recess 102.

In one embodiment, the second recess 108 is formed by isotropically etching the bottom surface of the first recess 104 (i.e., etching portions of the substrate 100 exposed in the first recess 102 in vertical and horizontal directions at the same rate). As a result of the isotropic etching, the maximum diameter of the second recess 108 is larger than the maximum diameter of the first recess 104. In the illustrated embodiment, the cross-sectional profile of the second recess 108 is curved (e.g., to resemble a circle or an ellipse).

After the first and second recesses 104 and 108 are formed, the first and second mask patterns 102 and 106 are removed from the substrate 100.

Figure 5:
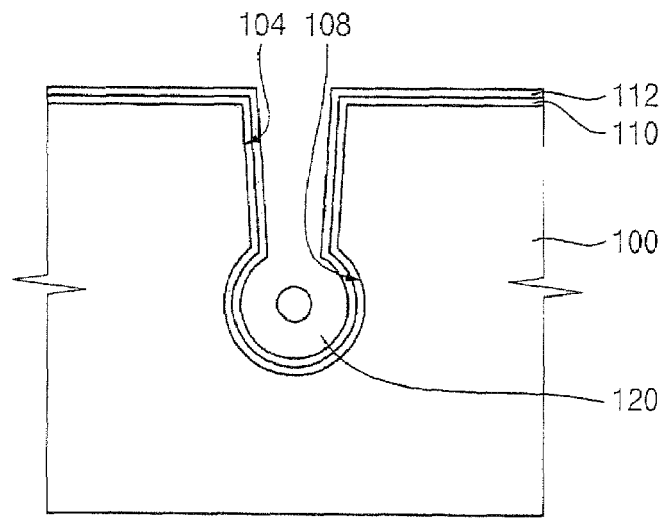

Referring to FIG. 5, a gate dielectric layer such as a gate oxide layer 110 is formed on the top surface of the substrate 100 and on sidewalls of the first and second recesses 104 and 108 (i.e., on the inner surface of the first and second recesses 104 and 108). In one embodiment, the gate oxide layer 110 includes a silicon oxide layer formed, for example, by exposing the substrate 100 to a thermal oxidation process. In another embodiment, the gate oxide layer 110 may include a metal oxide having a dielectric constant greater than that of the silicon oxide. Exemplary metal oxides include hafnium oxide, tantalum oxide, zirconium oxide, titanium oxide, aluminum oxide, or the like, or combinations thereof.

An undoped polysilicon layer 112 is then formed on the gate oxide layer 110 and along the sidewalls of the first and second recesses 104 and 108. In another embodiment, however, the undoped polysilicon layer 112 may be omitted if desired. If formed, the thickness of the undoped polysilicon layer 112 is selected to form a buffer layer adapted to prevent diffusion of impurities from a subsequently formed doped polysilicon layer into the gate oxide layer 110.

When the undoped polysilicon layer 112 is formed on the gate oxide layer 110, and to a thickness of less than about 10 Å, impurities within subsequently formed doped polysilicon layers can undesirably diffuse into the gate oxide layer 110. As a result, the undoped polysilicon layer 112 cannot function as a buffer layer capable of preventing impurity diffusion. However, when the undoped polysilicon layer 112 is formed on the gate oxide layer 110 to a thickness of more than about 100 Å, the undoped polysilicon layer 112 occupies an excessive volume within the second recess 108. As a result, a subsequently formed recessed gate electrode layer will not have a sufficient conductivity and void migration will be difficult to prevent. Accordingly, a buffer layer can be formed from an undoped polysilicon layer 112 having a thickness between about 10 Å and about 100 Å.

Figure 6:
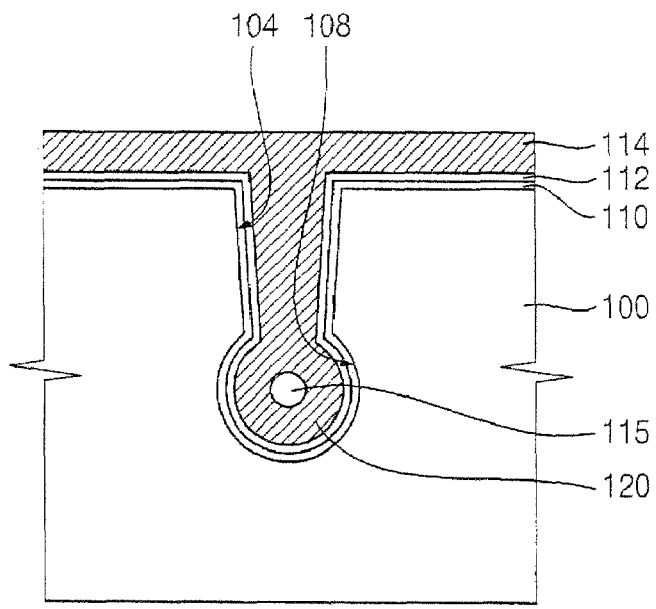

Referring to FIG. 6, a first preliminary polysilicon layer 114 is formed on the undoped polysilicon layer 112 to a thickness sufficient to fill the first and second recesses 104 and 108. In one embodiment, the first preliminary polysilicon layer 114 is doped with first conductivity-type impurities at a fourth impurity density ranging from about 3E20 atoms/cm3 to about 5E20 atoms/cm3. In another embodiment, the first preliminary polysilicon layer 114 is formed via a chemical vapor disposition (CVD) process or an atomic layer deposition (ALD) process. In one exemplary implementation, the first preliminary polysilicon layer 114 is formed via a low-pressure CVD (LPCVD) process. As illustrated, the step coverage of the first preliminary polysilicon layer 114 is about 100% and a void 115 is defined within a substantially central region of the first preliminary polysilicon layer 114 in the second recess 108.

The first preliminary polysilicon layer 114 contains first conductivity-type impurities thereby rendering the first preliminary polysilicon layer 114 conductive. The first preliminary polysilicon layer 114 forms a recessed gate electrode of a recessed transistor in a subsequent process. In one embodiment, the density of impurities within the first preliminary polysilicon layer 114 is sufficient to prevent the void 115 from migrating within the second recess 108 during subsequent high temperature processes.

In one embodiment, doping of the first preliminary polysilicon layer 114 may be performed in situ with the deposition process of the first preliminary polysilicon layer 114. For example, an impurity gas can also be supplied into the processing chamber simultaneously with source gases supplied into a processing chamber for the LPCVD process. In one embodiment, when impurities within the first preliminary polysilicon layer 114 are phosphorus (P) impurities, phosphate (PH3) gas can be supplied to the processing chamber as the impurity gas when the preliminary polysilicon layer 114 is deposited.

Figure 7:
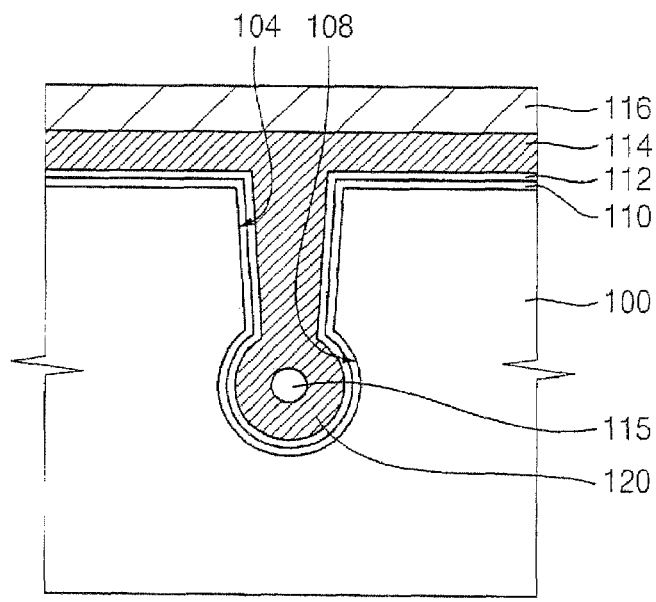

Referring to FIG. 7, a second preliminary polysilicon layer 116 is deposited on the first preliminary polysilicon layer 114. The second preliminary polysilicon layer 116 is doped with impurities (e.g., phosphorus (P)) at a fifth impurity density lower than the fourth impurity density. In one embodiment, the fifth impurity density ranges from about 1E20 atoms/cm3 to about 2E20 atoms/cm3. As illustrated, a top portion of the first recess 104 is covered by the first preliminary polysilicon layer 114. Accordingly, the second preliminary polysilicon layer 116 is not deposited in either of the first or second recesses 104 or 108.

In one embodiment, deposition of the second preliminary polysilicon layer 116 is performed in situ with deposition of the first preliminary polysilicon layer 114. That is, the first and second preliminary polysilicon layers 114 and 116 may be deposited onto the substrate 100 in the same processing chamber without a vacuum break. In one embodiment, the second preliminary polysilicon layer 116 is doped with the same impurities as the first preliminary polysilicon layer 114. In another embodiment, the second preliminary polysilicon layer 116 is formed under the same processing conditions with the exception that a smaller amount of phosphate (PH3) gas is supplied to the processing chamber during formation of the second preliminary polysilicon layer 116.

Figure 8:
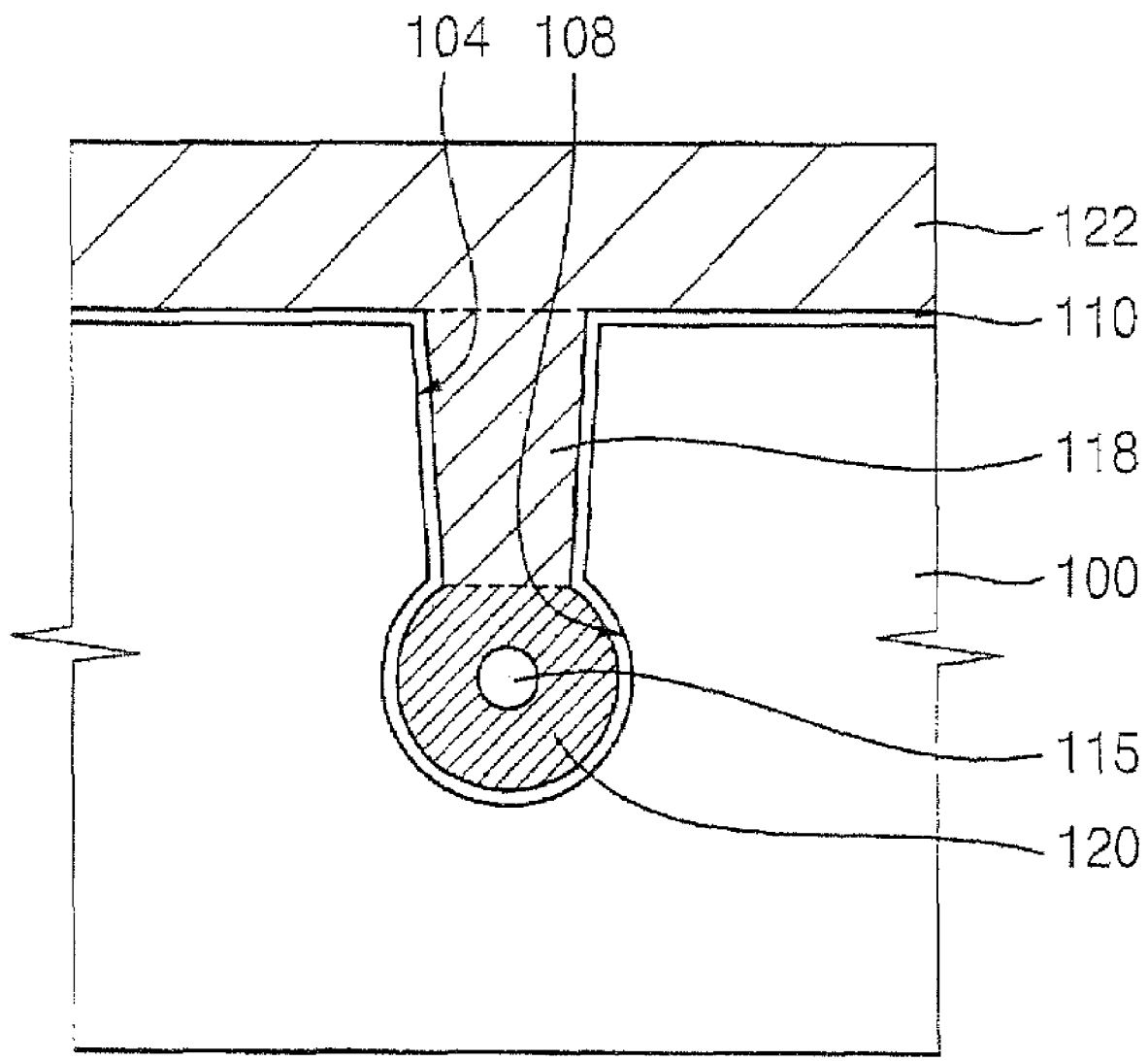

Referring to FIG. 8, after the first and second preliminary polysilicon layers 114 and 116 are formed, a first heat treatment is performed to activate the impurities contained therein. In one embodiment, the first heat treatment is performed for about 10 seconds to about 50 seconds at a temperature of about 800° C. to about 1000° C.

Next, a second heat treatment is performed on the first and second preliminary polysilicon layers 114 and 116 to diffuse the impurities contained in the first and second preliminary polysilicon layers 114 and 116 in all directions. As a result of the second heat treatment, the aforementioned first polysilicon layer 118 is formed within the first recess 104 and contains impurities at the aforementioned first impurity density, the aforementioned second polysilicon layer 120 is formed within the second recess 108 and contains impurities at the aforementioned second impurity density, and the aforementioned third polysilicon layer 122 is formed on a top surface of the substrate 100 and contains impurities at the aforementioned third impurity density.

As mentioned above, the maximum diameter of the second recess 108 is larger than the maximum diameter of the first recess 104. Consequently, impurities contained within the first preliminary polysilicon layer 114 do not easily diffuse from the second recess 108 into the first recess 104. As a result, the second impurity density is almost the same as the fifth impurity density. The second impurity density is not reduced during the second heat treatment and, as mentioned above, is sufficient to substantially prevent migration of the void 115 during subsequent processes.

Impurities contained within the first preliminary polysilicon layer 114 easily diffuse from the first recess 104 into the second preliminary polysilicon layer 116. Consequently, the first impurity density is lower than the second impurity density. For example, when the first preliminary polysilicon layer 114 is doped with phosphorus (P) with a fourth impurity density of about 4E20 atoms/cm$^3$ and the second preliminary polysilicon layer 116 is doped with phosphorus (P) with a fifth impurity density of about 1E20 atoms/cm$^3$, the second heat treatment diffuses phosphorus (P) impurities in the first and second preliminary polysilicon layers 114 and 116. As a result, the first polysilicon layer 118 is formed in the first recess 104 with a phosphorus (P) impurity density ranging from about 2.5E20 atoms/cm3 to about 3.5E20 atoms/cm$^3$ and the second polysilicon layer 120 is formed in the second recess 108 with a phosphorus (P) impurity density ranging from about 3.5E20 atoms/cm$^3$ to about 5.0E20 atoms/cm$^3$. Further, the third polysilicon layer 122 is formed on the top surface of the substrate 100 with a phosphorus (P) impurity density ranging from about 2.5E20 atoms/cm$^3$ to about 3.5 E20 atoms/cm$^3$.

Voids of conventional recessed gate electrodes migrate easily during subsequent processes and typically contact neighboring gate oxide layers. As a result, transistors that incorporate such conventional recessed gate electrodes experience an increase in leakage current and fluctuating threshold voltage. However, because the second polysilicon layer 120 exemplarily described above with respect to FIGS. 2-8 is doped with impurities at a sufficient density to minimize silicon diffusion, the void 115 may be substantially prevented from migrating. As a result, the deleterious effects caused by the void migration may be minimized in the recessed gate electrode structure described above with respect to FIGS. 2-8.

Figure 9:
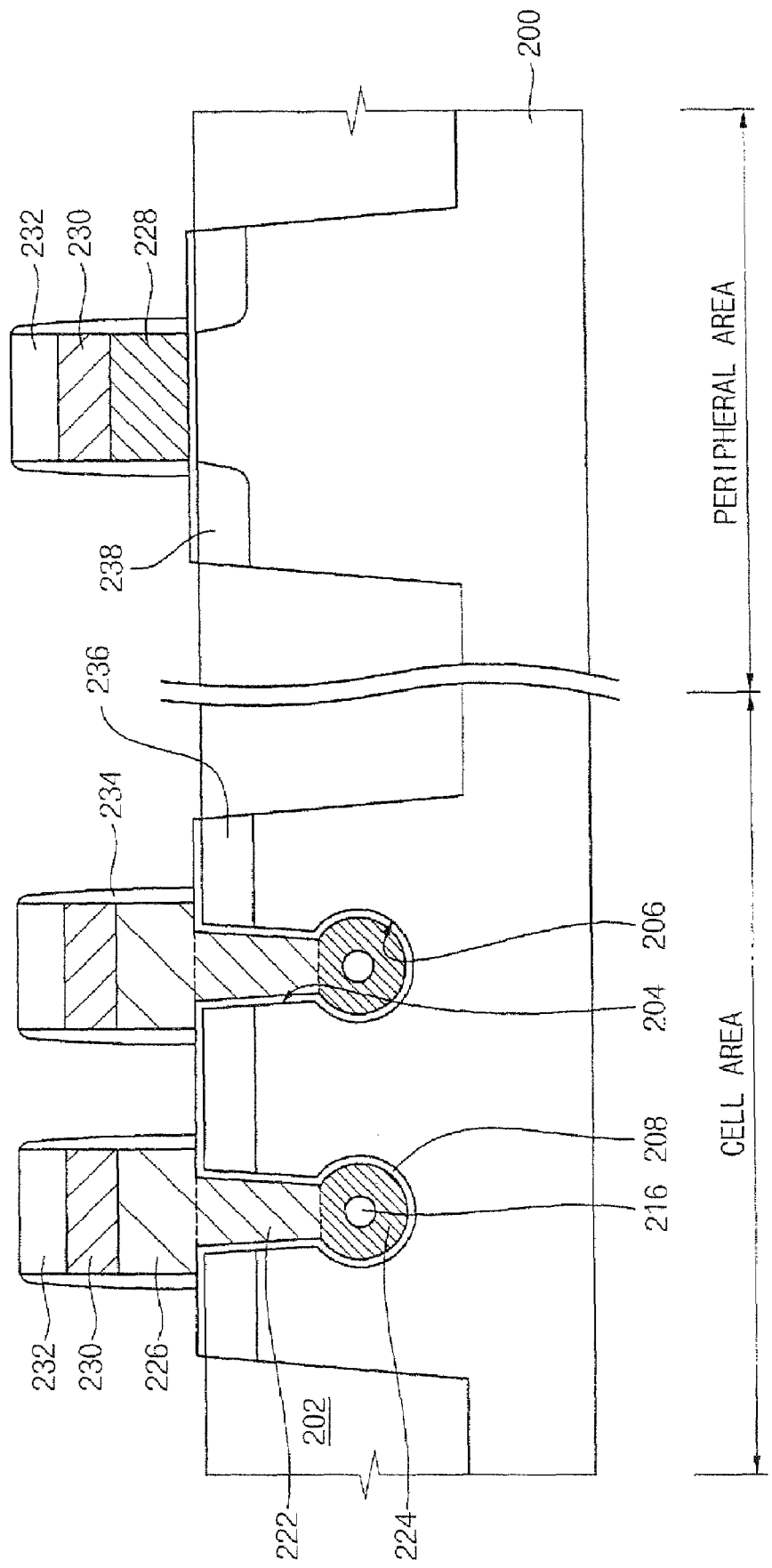
FIG. 9 illustrates a cross-sectional view, along a first direction, of a semiconductor device incorporating the recessed gate electrode shown in FIG. 2, in accordance with one embodiment.
Figure 10:
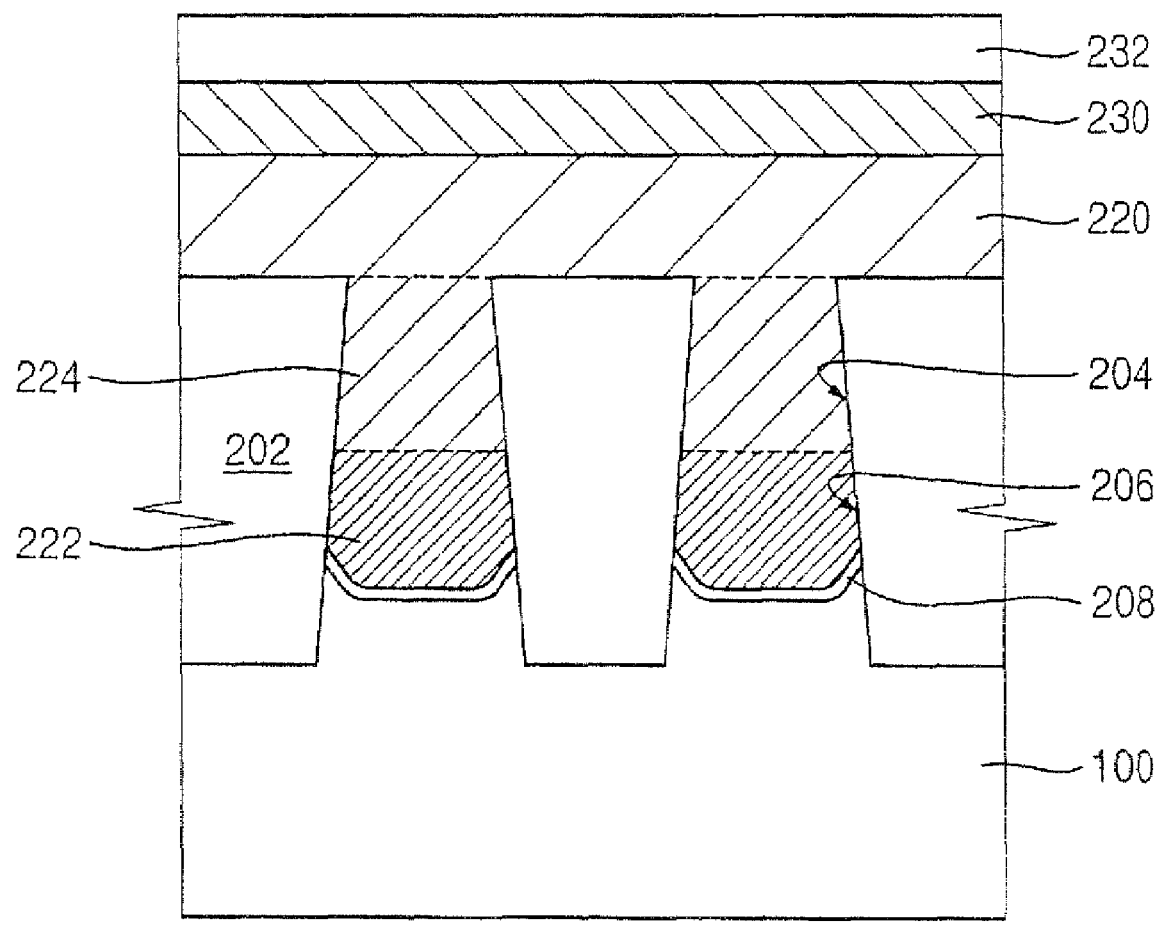
FIG. 10 illustrates a cross-sectional view, along a second direction, of a semiconductor device incorporating the recessed gate electrode shown in FIG. 2, in accordance with one embodiment.

FIGS. 9 and 10 illustrate cross-sectional views, along first and second directions, respectively, of a semiconductor device incorporating the recessed gate electrode shown in FIG. 2, in accordance with one embodiment. In the illustrated embodiment, the semiconductor device is exemplarily described as a dynamic random-access memory (DRAM).

Referring to FIGS. 9 and 10, a substrate 200 (e.g., a silicon wafer) is divided into a cell area in which a unit cell of the DRAM device is formed and a peripheral area in which an electric circuit for operating the unit cells is formed. A device isolation layer 202 is formed in each of the cell and peripheral areas and defines active regions in which various conductive structures may be formed. In one embodiment, the device isolation layer 202 is formed via a shallow trench isolation (STI) process.

For purposes of discussion, the active region in the cell area is referred to herein as a "first active region" and the active region in the peripheral area is referred to as a "second active region." In addition, the first and second directions are substantially perpendicular to each other, wherein the first direction represents a longitudinal direction of a gate electrode of a transistor and the second direction represents a latitudinal direction of the gate electrode. In one embodiment, the first active region is shaped as an isolated island along the first direction.

Recessed transistors are formed in the cell area of the substrate 200. Therefore, pairs of first and second recesses 204 and 206, with the second recess 206 in communication with the first recess 204, are formed in the first active region of the substrate 200. Planar transistors are formed in the peripheral area of the substrate 200. Therefore, recesses are not formed in the second active region of the substrate 200.

When viewed along the first direction as shown in FIG. 9, the maximum diameter of the second recess 206 is larger than the maximum diameter of the first recess 204 and has a cross-sectional profile that is curved (e.g., to resemble a circle or an ellipse). However, when viewed along the second direction as shown in FIG. 10, the device isolation layer is exposed by the first and second recesses 204 and 206 so that the first and second recesses 204 and 206 have the same sidewall profile as the device isolation layer 202.

A gate oxide layer 208 is formed on a top surface of the substrate 200 in the cell and peripheral areas as well as on sidewalls of the first and second recesses 204 and 206 (i.e., inner surface of the first and second recesses 204 and 206). The gate oxide layer 208 may include silicon oxide or a metal oxide having a dielectric constant greater than the silicon oxide.

A first polysilicon pattern 222 is formed in the first recess 204 and a second polysilicon pattern 224 is formed in the second recess 206. A void 216 is defined within a substantially central region of the second polysilicon pattern 224 due to a local deficiency of polysilicon in the second recess 206. In one embodiment, the first polysilicon pattern 222 is doped with first conductivity-type impurities at the first impurity density and the second polysilicon pattern 224 is doped with first conductivity-type impurities at the second impurity density, wherein the second impurity density is greater than the first impurity density. In another embodiment, the first and second polysilicon patterns 222 and 224 are formed in the same deposition process (e.g., as described above with respect to FIGS. 2-8).

The second polysilicon pattern 224 may be rendered conductive due to the presence of impurities and the migration of the void 216 may be prevented during subsequent processes due to impurities contained within the second polysilicon pattern 224. In one embodiment, the second impurity density of impurities in the second polysilicon pattern 224 may be sufficient to prevent the void 216 from migrating within the second polysilicon pattern 224. In one embodiment, an N-type MOS (NMOS) transistor is formed in the cell area of the substrate. In such an embodiment, the first conductivity-type impurities include N-type impurities. For example, when the second polysilicon pattern 224 is doped with an N-type impurity such as phosphorus (P), the second impurity density may range from about $2.5E20$ atoms/cm$^3$ to about $5E20$ atoms/cm$^3$ (e.g., from about $3.5E20$ atoms/cm$^3$ to about $5E20$ atoms/cm3).

The first impurity density may be less than or equal to the second impurity density of the impurities in the second polysilicon pattern 224. For example, when the second polysilicon pattern 224 is doped with phosphorus (P) impurities at a second impurity density ranging from about $3.5E20$ atoms/cm$^3$ to about $5E20$ atoms/cm$^3$, the first polysilicon pattern 222 may be doped with phosphorus (P) impurities at a first impurity density ranging from about $2.5E20$ atoms/cm$^3$ to about $3.5E20$ atoms/cm$^3$.

A third polysilicon pattern 226 is formed on the gate oxide layer 208 and the first polysilicon pattern 222 in the cell area of the substrate 200. In one embodiment, the third polysilicon pattern 226 is doped with impurities at a third impurity density less than the first impurity density. In another embodiment, the third polysilicon pattern 226 is doped with the same impurities as contained within the first and second polysilicon patterns 222 and 224. Thus, when the first polysilicon pattern 222 is doped with phosphorus (P) impurities at a first impurity density ranging from about $2.5E20$ atoms/cm$^3$ to about $3.5E20$ atoms/cm3, the third polysilicon pattern 226 may be doped with phosphorus (P) impurities at a third impurity density ranging from about $1.5E20$ atoms/cm$^3$ to about $2.3E20$ atoms/cm$^3$.

A fourth polysilicon pattern 228 is formed in the peripheral area of the substrate 200 in which a P-type MOS (PMOS) transistor is to be formed. The fourth polysilicon pattern 228 is doped with first conductivity-type impurities and second conductivity-type impurities that are different from first conductivity-type impurities. In one embodiment, the fourth polysilicon pattern is doped with first conductivity-type impurities at the third impurity density.

An upper conductive pattern 230 and a hard mask pattern 232 are formed on the first, second, third and fourth polysilicon patterns 222, 224, 226 and 228, respectively. The upper conductive pattern 230 may include metal and metal silicide. The hard mask pattern 232 may include silicon nitride.

Source/drain regions are formed at surface areas of the substrate 200 around the first, second, third and fourth polysilicon patterns 222, 224, 226 and 228. For example, first source/drain regions 236, doped with first conductivity-type impurities, are formed at surface areas of the substrate 200 adjacent to stacked structures including the first, second and third polysilicon patterns 222, 224, and 226. Similarly, second source/drain regions 238, doped with second conductivity-type impurities, are formed at surface areas of the substrate 200 adjacent to a stacked structure including the fourth polysilicon pattern 228.

As described above, the third and fourth polysilicon patterns 226 and 228 are formed on the top surface of the substrate 200 and have a lower impurity density than the first and second polysilicon patterns 222 and 224, which are formed in the first and second recesses 204 and 206. Accordingly, when a first transistor is formed on the peripheral area of the substrate 200, the conductivity-type of the first transistor is different from that of a second transistor formed on the cell area of the substrate 200 and an impurity density of the first transistor may be slightly reduced. Accordingly, various processing defects caused by the doping process of the impurities may be sufficiently reduced, thereby improving operational characteristics of a semiconductor device.

FIGS. 11 to 16 are sectional diagrams illustrating a method of manufacturing the semiconductor device shown in FIG. 9.

Figure 11:
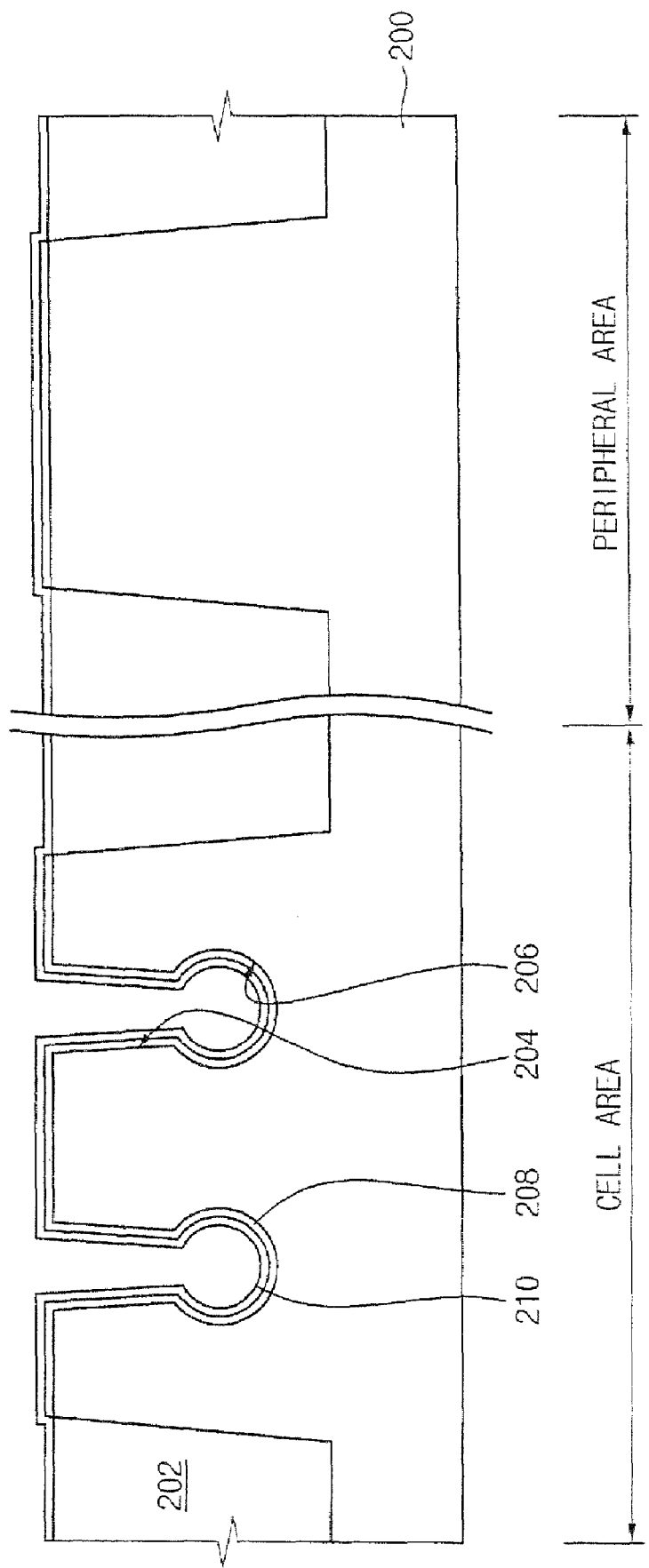
FIGS. 11 to 16 are sectional diagrams illustrating a method of manufacturing the semiconductor device shown in FIG. 9.

Referring to FIG. 11, a semiconductor substrate 200 (e.g., a silicon wafer) is provided and is divided into a cell area, in which unit cells of a memory device will be subsequently formed, and a peripheral area, in which electric circuits for operating the unit cells are formed.

A shallow trench isolation (STI) process is performed on the substrate 200 to form a device isolation layer 202 within the substrate 200. The device isolation layer 202 defines active regions in which various conductive structures may be formed. For purposes of discussion, the active region in the cell area is referred to as a "first active region" and the active region in the peripheral area is referred to as a "second active region."

Next, the substrate 200 is anisotropically etched (e.g., as described above with respect to FIG. 3) to form a first recess 204 in the first active region of the substrate 200. In one embodiment, a sidewall of the first recess 204 is inclined slightly with respect to a top surface of the substrate 200. In another embodiment, the sidewall of the first recess 204 is substantially perpendicular to the top surface of the substrate 200.

After the first recess 204 is formed, a mask layer (not shown) is formed on a sidewall of the first recess 204 (e.g., as described above with respect to FIG. 3) and a bottom surface of the first recess 204 is isotropically etched using the mask layer as an etching mask. As a result, a second recess 206 is formed beneath the first recess 204 and communicates with the first recess 204.

When the substrate 200 including the first and second recesses 204 and 206 is viewed vertically along a longitudinal direction of a gate electrode of the semiconductor device, the maximum diameter of the second recess 206 is larger than the maximum diameter of the first recess 204 and has a cross-sectional profile that is curved (e.g., to resemble a circle or an ellipse). In addition, although not shown, a sidewall of the device isolation layer 202 is exposed by the first and second recesses 204 and 206 along a latitudinal direction of the gate electrode of the semiconductor device.

A gate oxide layer 208 is formed on the top surface of the substrate 200 and on sidewalls of the first and second recesses 204 and 206 (i.e., inner surface of the first and second recesses 204 and 206). In one embodiment, the gate oxide layer 208 includes a silicon oxide layer formed, for example, by exposing the substrate 200 to a thermal oxidation process. In another embodiment, the gate oxide layer 208 includes a metal oxide having a dielectric constant greater than that of the silicon oxide. Exemplary metal oxides include hafnium oxide, tantalum oxide, zirconium oxide, titanium oxide, aluminum oxide, or the like, or combinations thereof.

An undoped polysilicon layer 210 is then formed on the gate oxide layer 208, along the sidewalls of the first and second recesses 204 and 206. The undoped polysilicon layer 210 may act as a buffer layer to prevent impurities of a doped polysilicon layer from diffusing into the gate oxide layer 208 during subsequent processes. In another embodiment, however, the undoped polysilicon layer 210 may be omitted if desired.

Figure 12:
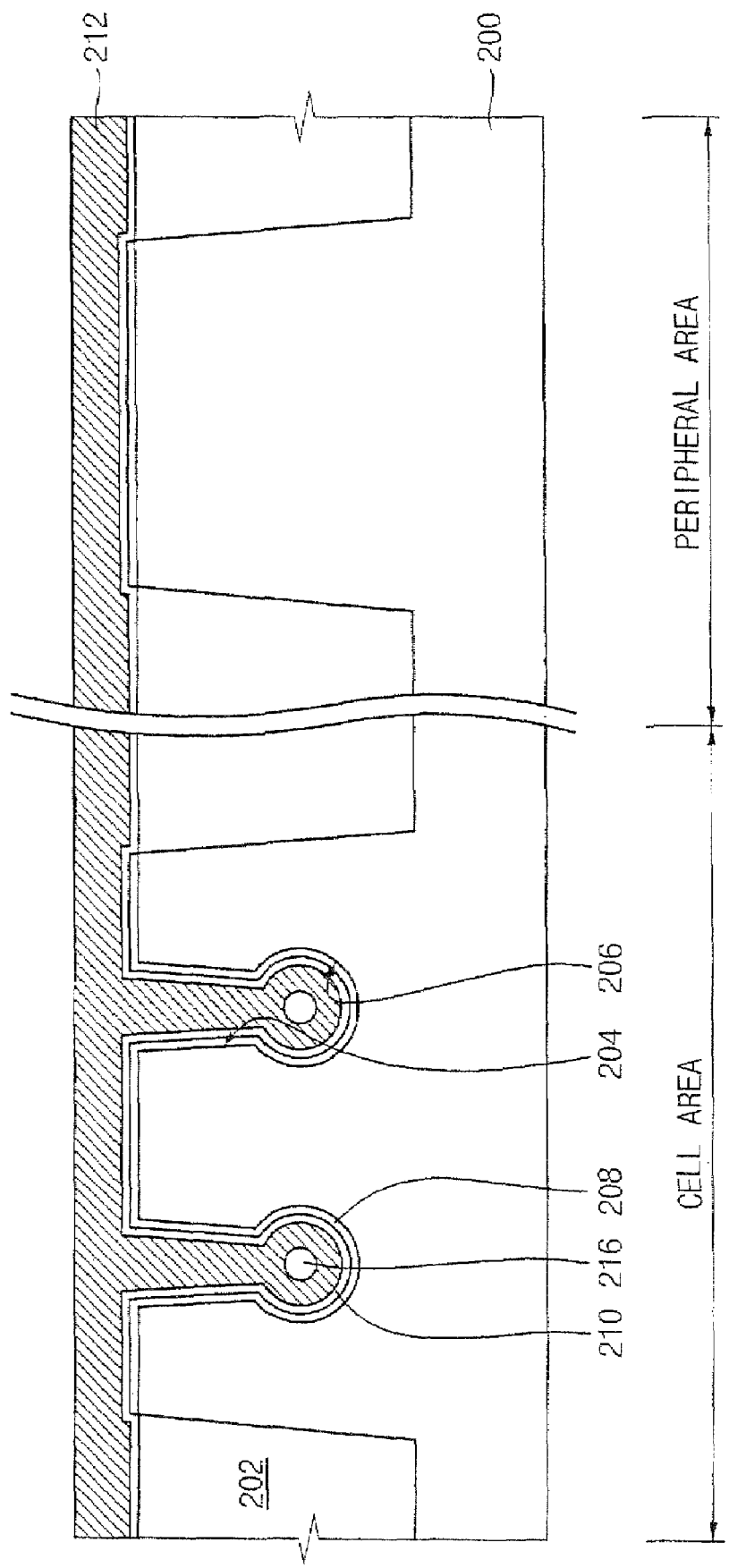

Referring to FIG. 12, a first preliminary polysilicon layer 212 is formed on the undoped polysilicon layer 210 to a thickness sufficient to fill the first and second recesses 204 and 206. In one embodiment, the first preliminary polysilicon layer 212 is doped with first conductivity-type impurities at a fourth impurity density ranging from about 3E20 atoms/cm3 to about 5E20 atoms/cm3. In another embodiment, the first preliminary polysilicon layer 212 is formed via a chemical vapor disposition (CVD) process or an atomic layer deposition (ALD) process. In one implementation, the first preliminary polysilicon layer 212 is formed via a low-pressure CVD (LPCVD) process. As illustrated, the step coverage of the first preliminary polysilicon layer 212 is about 100% and a void 216 is defined within a substantially central region the first preliminary polysilicon layer 212 in the second recess 206.

In one embodiment, the first preliminary polysilicon layer 212 may be doped with impurities at a fourth impurity density sufficient to prevent the void 216 from migrating within the second recess 206 during subsequent high temperature processes. In one embodiment, the fourth impurity density may be equal to or greater than the second impurity density of a second polysilicon layer 224 that is ultimately formed in the second recess 206.

In one embodiment, the first preliminary polysilicon layer 212 is doped with phosphorus (P) impurities at the fourth impurity density (i.e., ranging from about 3E20 atoms/cm$^3$ to about 5E20 atoms/cm$^3$). In such a case, phosphate (PH$_3$) gas is supplied to the processing chamber as the impurity gas during deposition of the first preliminary polysilicon layer 212.

Figure 13:
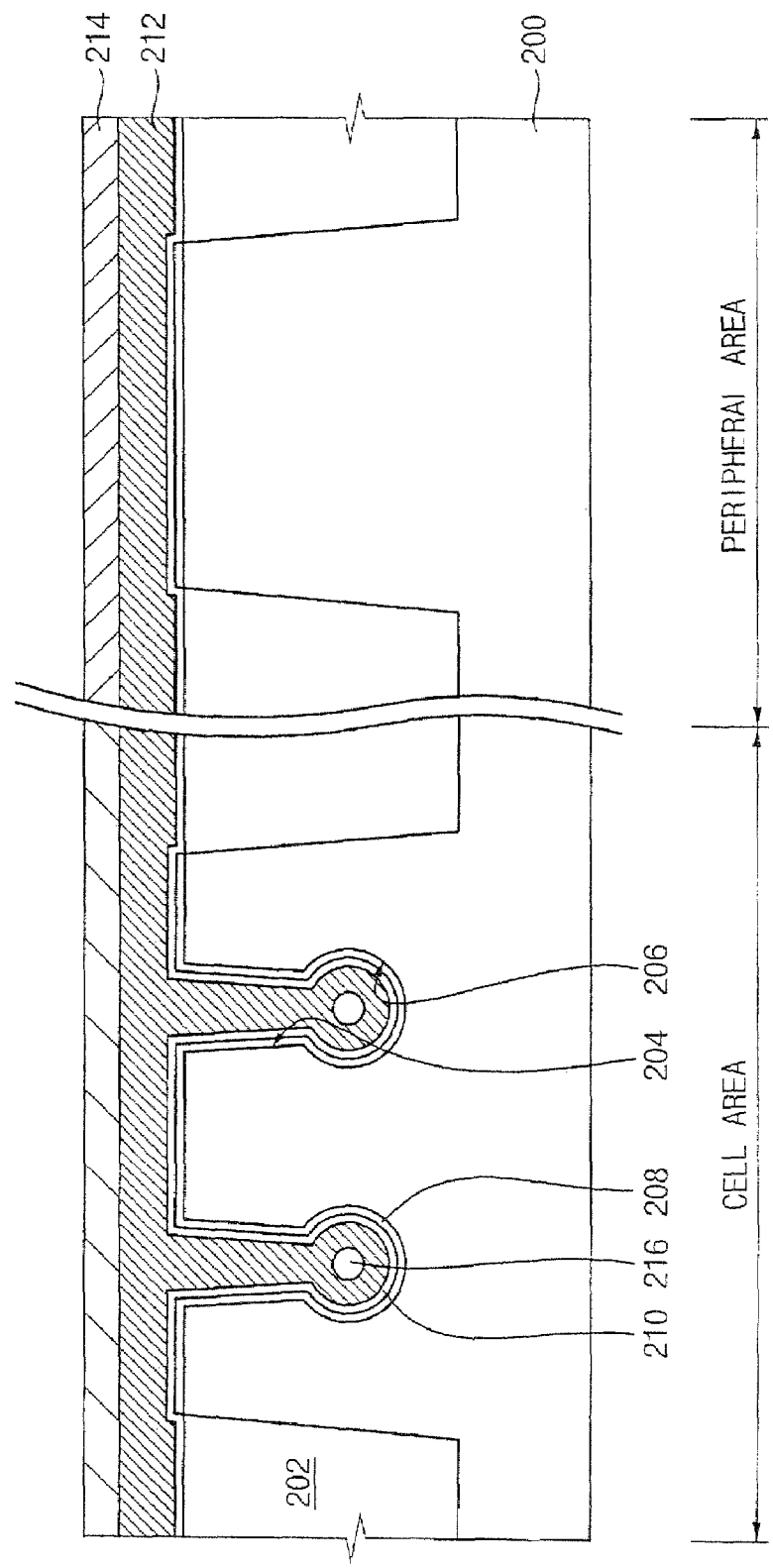

Referring to FIG. 13, a second preliminary polysilicon layer 214 is deposited on the first preliminary polysilicon layer 212. The second preliminary polysilicon layer 214 is doped with first conductivity-type impurities (e.g., phosphorus (P)) at a fifth impurity density lower than the fourth impurity density. In one embodiment, the fifth impurity density ranges from about 1E20 atoms/cm$^3$ to about 2E20 atoms/cm$^3$. As illustrated, a top portion of the first recess 204 is covered by the first preliminary polysilicon layer 212. Accordingly, the second preliminary polysilicon layer 214 is not deposited either in the first and second recesses 204 and 206.

In one embodiment, deposition of the second preliminary polysilicon layer 214 may be performed in situ with deposition of the first preliminary polysilicon layer 212. That is, the first and second preliminary polysilicon layers 212 and 214 may be deposited onto the substrate 200 in the same processing chamber without a vacuum break. In one embodiment, the second preliminary polysilicon layer 214 contains the same impurities as contained within the first preliminary polysilicon layer 212. In another embodiment, the second preliminary polysilicon layer 214 is formed just after the first preliminary polysilicon layer 212, in the same processing chamber and under the same processing conditions with the exception that a smaller amount of phosphate (PH$_3$) gas is supplied to the processing chamber during formation of the second preliminary polysilicon layer 214.

In one embodiment, the fifth impurity density of the second preliminary polysilicon layer 214 is less than the fourth impurity density of the first preliminary polysilicon layer 212 to facilitate formation of a PMOS transistor from the second preliminary polysilicon layer 214 in a subsequent process. When the second preliminary polysilicon layer 214 is doped with first conductivity-type impurities at an excessive density, an even greater density of second conductivity-type impurities, different from first conductivity-type impurities, must be doped into the second preliminary polysilicon layer 214 to form a second conductivity-type transistor on the peripheral area of the substrate 200. However, when second conductivity-type impurities are excessively doped into the second preliminary polysilicon layer 214, they tend to diffuse into the channel region through the gate oxide layer 208 and cause undesirable processing defects. As a result, the fifth impurity density (i.e., the density at which the second preliminary polysilicon layer 214 is doped with impurities of the first conductivity type) is less than the fourth impurity density of the first preliminary polysilicon layer 212.

Figure 14:
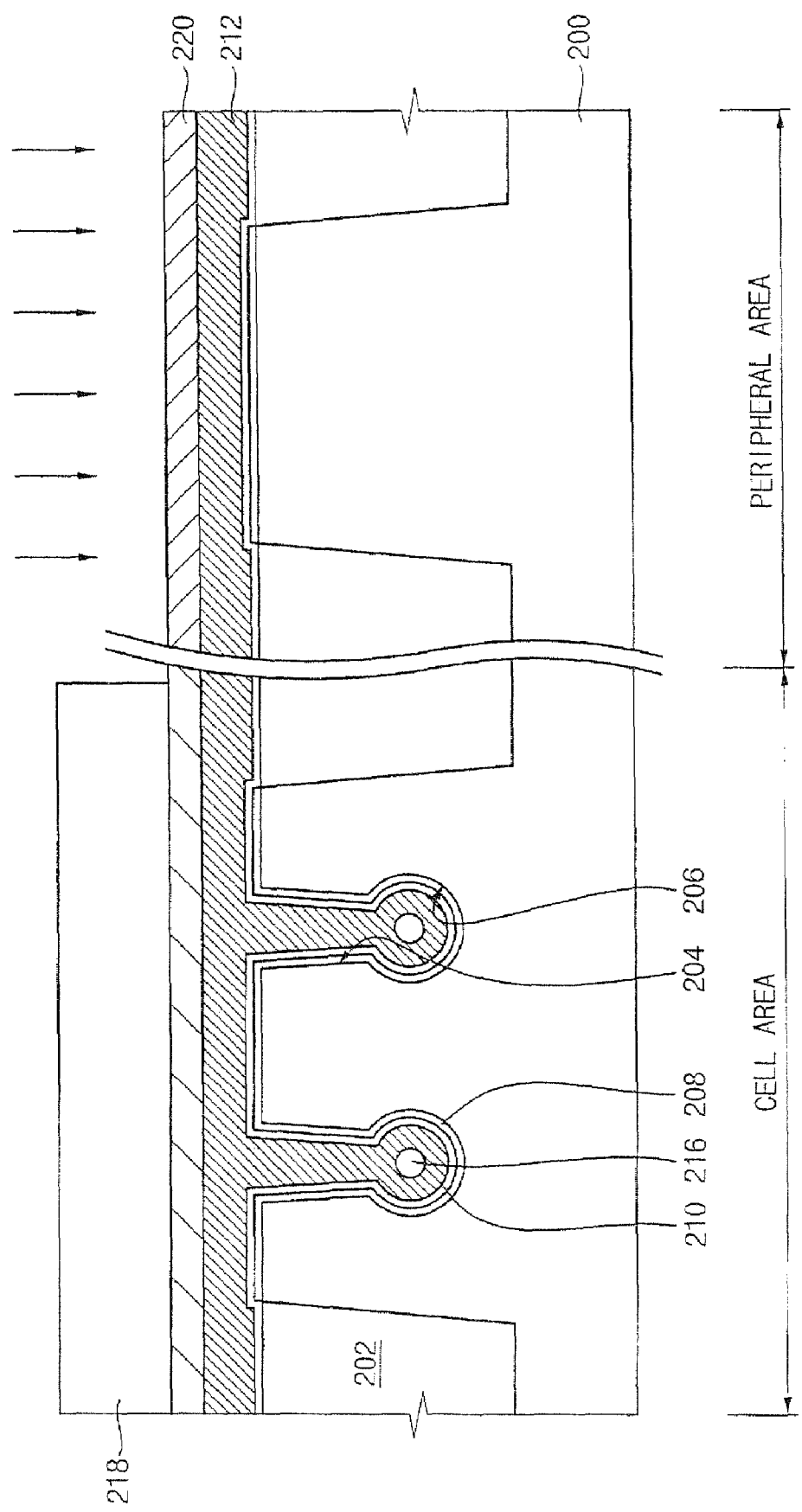

Referring to FIG. 14, a photoresist pattern 218 is formed on the second preliminary polysilicon layer 214. As illustrated, a portion of the second preliminary polysilicon layer 214 on the peripheral area of the substrate 200 is exposed by the photoresist pattern 218. In one embodiment, the location of the exposed portion of the second preliminary polysilicon layer 214 corresponds to a location of the peripheral area in which a PMOS transistor is to be formed in a subsequent process.

Next, the second conductivity-type impurities are implanted into the second preliminary polysilicon layer 214 using the photoresist pattern 218 as an implantation mask. As a result, a third preliminary polysilicon layer 220 is locally formed in the peripheral area of the substrate 200. In one embodiment, second conductivity-type impurities include a P-type impurity such as boron (B). Boron fluoride (BF$_3$) gas may be used in the ion implantation process to form the third preliminary polysilicon layer 220. Because the second preliminary polysilicon layer 214 is doped with impurities of the first conductivity type at the fifth impurity density (which is less than the fourth impurity density of the first preliminary polysilicon layer 212), the second conductivity-type impurities need not be highly doped into the second preliminary polysilicon layer 214. Accordingly, the second conductive impurities may be prevented from penetrating into the channel region.

Figure 15:
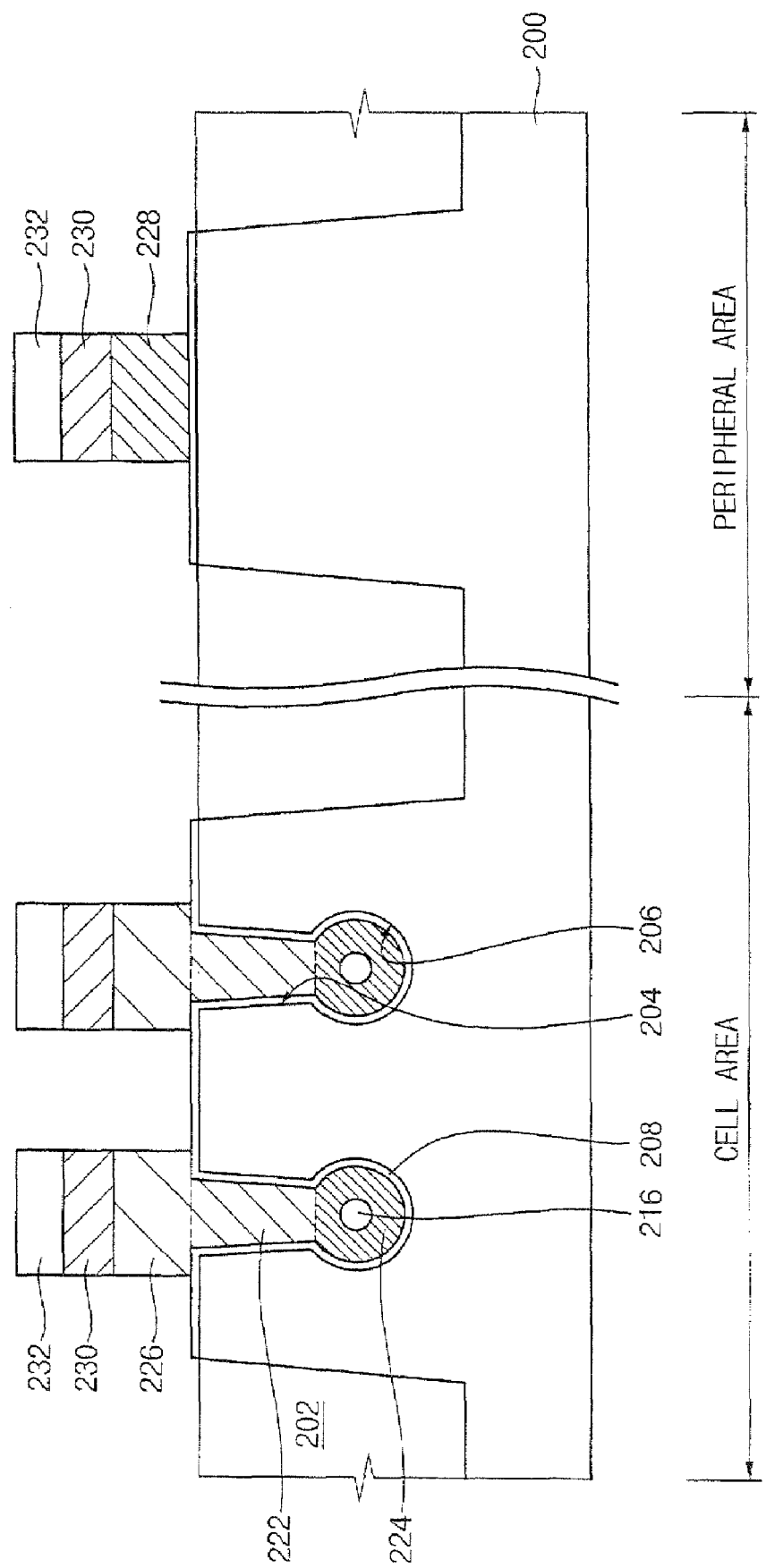

Referring to FIG. 15, after second conductivity-type impurities have been implanted, a first heat treatment is performed to activate the impurities contained in the first and second preliminary polysilicon layers 212 and 214. In one embodiment, the first heat treatment is performed for about 10 seconds to about 50 seconds at a temperature of about 800° C. to about 1000° C.

Next, an upper conductive layer (not shown) is formed on the first and second preliminary polysilicon layers 212 and 214. In one embodiment, the upper conductive layer includes a metal layer or a metal silicide layer. A hard mask pattern 232 is subsequently formed on the upper conductive layer.

The upper conductive layer, the second preliminary polysilicon layer 214, and the first preliminary polysilicon layer 212 are sequentially etched using the hard mask pattern 232 as an etching mask, thereby forming gate structures that fill the first and second recesses 204 and 206 and protrude from the surface of the substrate 200. For example, a first gate structure is formed in the cell area of the substrate 200 and a second gate structure is formed in the peripheral area of the substrate 200. The first gate structure includes the gate oxide layer 208, the optional buffer layer (not shown), the first to third polysilicon patterns 222, 224, and 226, the upper conductive pattern 230, and the hard mask pattern 232 that are sequentially stacked on the substrate 200 at the cell area. The second gate structure includes the gate oxide layer 208, the optional buffer layer (not shown), the fourth polysilicon pattern 228, the upper conductive pattern 230, and the hard mask pattern 232 that are sequentially stacked on the substrate 200 at the peripheral area. Further, a third gate structure (not shown) may be formed on a portion of the substrate of the peripheral area and includes the gate oxide layer 208, the optional buffer layer (not shown), the third polysilicon pattern 226, the upper conductive pattern 230, and the hard mask pattern 232 that are sequentially stacked on the substrate 200 in the peripheral area.

In one embodiment, the deposition process for the upper conductive layer and the hard mask layer, the photolithography process, and the etching process may be performed at temperatures high enough to sufficiently diffuse the impurities contained within the first, second and third preliminary polysilicon layers 212, 214 and 220. Accordingly, impurities contained in the first, second and third preliminary polysilicon layers 212, 214 and 220 can be diffused such that the impurity densities of each of the first, second and third preliminary polysilicon layers 212, 214 and 220 are varied during the aforementioned upper conductive layer and hard mask layer deposition processes, the photolithography process, and the etching process.

As shown in FIG. 15, the first polysilicon pattern 222 is formed in the first recess 204 and the second polysilicon pattern 224 is formed in the second recess 206. The first polysilicon pattern 222 is doped with first conductivity-type impurities at the first impurity density and the second polysilicon pattern 224 is doped with first conductivity-type impurities at the second impurity density, which is higher than the first impurity density. The third and fourth polysilicon patterns 226 and 228 are formed on the top surface of the substrate 200 and are doped with first conductivity-type impurities at the third impurity density, which is lower than the first impurity density.

In one embodiment, the first preliminary polysilicon layer 212 is doped with phosphorus (P) impurities at an impurity density of about 4E20 atoms/cm$^3$ and the second preliminary polysilicon layer 214 is doped with phosphorus (P) impurities at an impurity density of about 1E20 atoms/cm$^3$. In such an embodiment, the first polysilicon pattern 222 is doped with phosphorus (P) impurities at an impurity density ranging from about 2.5E20 atoms/cm$^3$ to about 3.5E20 atoms/cm$^3$ and the second polysilicon pattern 224 is doped with phosphorus (P) impurities at an impurity density ranging from about 3.5E20 atoms/cm3 to about 5E20 atoms/cm$^3$ due to diffusion of impurities from the first and second preliminary polysilicon layers 212 and 214. Moreover, the third and fourth polysilicon patterns 226 and 228 are doped with phosphorus (P) impurities at an impurity density ranging from about 1.5E20 atoms/cm$^3$ to about 2.3E20 atoms/cm$^3$ due to diffusion of impurities from the first and second preliminary polysilicon layers 212 and 214. Further, fourth polysilicon pattern 228 is doped with P-type impurities including a Group III elements such as boron (B).

Figure 16:
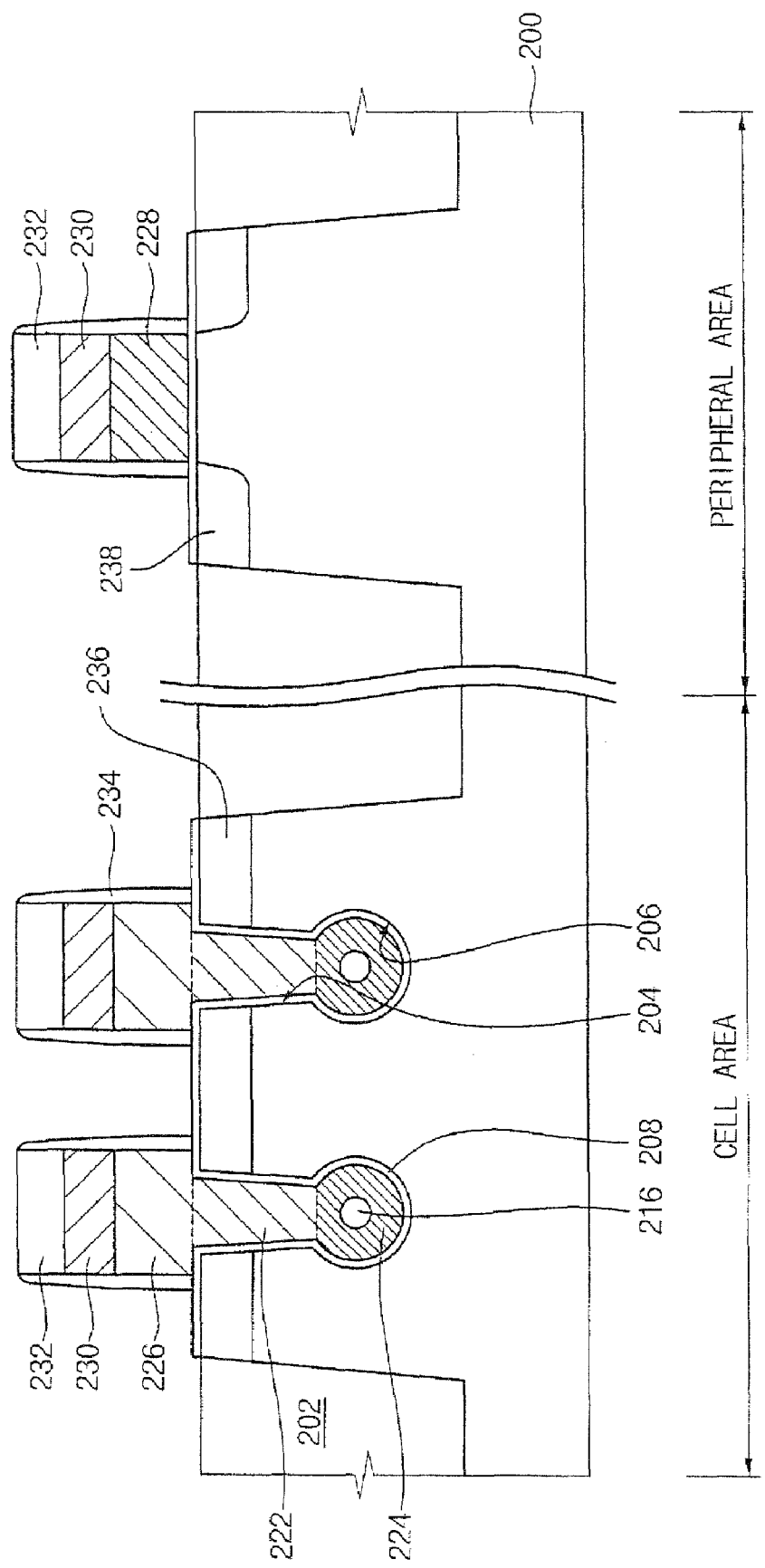

Referring to FIG. 16, spacers 234 are formed on sidewalls of the aforementioned first, second and third gate structures. Next, first conductivity-type impurities may be implanted into the substrate 200 using the first and third gate structures as an implantation mask to thereby form first source/drain regions 236 at surface areas of the substrate adjacent to the first, second and third gate structures. Further, second conductivity-type impurities may be implanted into the substrate 200 using the second gate structure as an implantation mask to thereby form second source/drain regions 238 at surface areas of the substrate adjacent to the second gate structure.

As exemplarily described herein, a recessed transistor includes a recessed gate electrode structure having a first recess and a second recess, wherein the second recess is larger than the first recess. Moreover, a void in a portion of the recessed gate electrode in the second recess may be sufficiently prevented from migrating due to a high impurity density contained within polysilicon material present in the second recess. By substantially preventing void migration, operational characteristics of the recessed transistor can be improved. Further, although a planar transistor and the recessed transistor are of different conductivity-types, impurities within the planar transistor may be sufficiently prevented from penetrating into the channel region. As a result, operational characteristics of the planar transistor and production yield of the semiconductor device may be improved.

The invention may be practiced in many ways. What follows are exemplary, non-limiting descriptions of some embodiments of the invention.

According to some embodiments, there is provided a method of manufacturing a recessed gate electrode structure for a semiconductor device. The recessed gate electrode structure may include a substrate having a first recess and a second recess in communication with the first recess, a gate oxide layer on a top surface of the substrate and on an inner surface of the first and second recesses, a first polysilicon layer filling the first recess and doped with impurities at a first impurity density, a second polysilicon layer filling the second recess and doped with the impurities at a second impurity density higher than the first impurity density, and a third polysilicon layer on the gate oxide layer and the first polysilicon layer. The second recess is larger than the first recess and a void is defined within the second polysilicon. The third polysilicon layer is doped with the impurities at a third impurity density.

According to other embodiments, there is provided a method of forming a recessed gate electrode structure. A semiconductor substrate is etched to form a first recess and a second recess in communication with the first recess. The second recess is larger than the first recess. A gate oxide layer is formed on a surface of the substrate and on an inner surface of the first and second recesses. A first polysilicon layer is formed in the first recess and the first polysilicon layer is doped with impurities at a first impurity density. A second polysilicon layer is formed in the second recess in such a way that the second polysilicon layer is doped with the impurities at a second impurity density higher than the first impurity density and defines a void therein. A third polysilicon layer is formed on the gate oxide layer and the first polysilicon layer. The third polysilicon layer is doped with the impurities at a third impurity density.

According to still other embodiments, there is provided a semiconductor device including a recessed gate electrode. A semiconductor device is provided including a first region and a second region. The first region of the substrate includes a first recess and a second recess in communication with the first recess and is larger than the first recess. A gate oxide layer is continuously formed on a surface of the substrate and on inner surfaces of the first and second recesses. The semiconductor device includes a first polysilicon pattern filling the first recess, a second polysilicon pattern filled the second recess, a third polysilicon pattern formed on the gate oxide and the first polysilicon pattern in the first region of the substrate, and a fourth polysilicon pattern formed on the substrate in the second region. The first polysilicon pattern is doped with first conductivity-type impurities at a first impurity density, and the second polysilicon pattern is doped with first conductivity-type impurities at a second impurity density higher than the first impurity density and defines a void therein. The third polysilicon pattern is doped with the first conductivity-type impurities at a third impurity density lower than the first impurity density and the fourth polysilicon pattern is doped with the first conductivity-type impurities at the third impurity density and with second conductivity-type impurities at a fourth impurity density.

According to further embodiments, there is provided a method of manufacturing a semiconductor device including a recessed gate electrode structure. A semiconductor substrate, on which a first region and a second region are divided, is etched to form a first recess and a second recess in communication with the first recess in the first region of the substrate. The second recess is larger than the first recess. A gate oxide layer is formed on a top surface of the substrate and on an inner surface of the first and second recesses. A first polysilicon pattern is formed in the first recess. The first polysilicon pattern is doped with first conductivity-type impurities at a first impurity density. The second polysilicon pattern is formed in the second recess. The second polysilicon pattern is doped with the first conductivity-type impurities at a second impurity density higher than the first impurity density and defines a void therein. A third polysilicon layer is formed on the gate oxide layer and the first polysilicon pattern. The third polysilicon pattern is doped with the first conductivity-type impurities at a third impurity density. Second conductivity-type impurities are locally implanted onto the third polysilicon layer in the second region of the substrate, thereby forming a fourth polysilicon layer into which the first conductivity-type impurities are doped at the third impurity density and the second conductivity-type impurities are doped at a fourth impurity density. The third and fourth polysilicon layers are patterned to thereby form third and fourth polysilicon patterns on the substrate.

According to several embodiments, impurities are doped into the second polysilicon layer, formed in the second recess, at an impurity density lower than the third polysilicon layer, formed on a surface of the substrate. Accordingly, much more impurities are positioned in a silicon lattice of the second polysilicon layer than are impurities that are positioned in a silicon lattice of the third polysilicon layer. Accordingly, silicon atoms may be prevented from diffusing in a subsequent heat treatment due to the impurities. As a result, void migration in the second polysilicon layer may be sufficiently prevented.

According to several other embodiments, the third polysilicon layer is formed on a top surface of the substrate at an impurity density lower than the first polysilicon layer in the first recess, so that a planar transistor can be easily formed as a conductivity-type that is different from the conductivity-type of the a recessed transistor. As a result, the impurity density at a lower portion of the recessed gate electrode may be higher than the impurity density at an upper portion of the recessed gate electrode and void migration may be sufficiently prevented in the lower portion of the recessed gate electrode. Accordingly, operational characteristics of a metal-oxide semiconductor (MOS) transistor including the recessed gate electrode structure may be remarkably improved. For example, current leakage and fluctuation of threshold voltage in a MOS transistor formed using such a recessed gate electrode may be significantly reduced.

The foregoing is illustrative of the invention and is not to be construed as limiting thereof. Although a few example embodiments of the invention have been described, those skilled in the art will readily appreciate that many modifications are possible in the example embodiments without materially departing from the novel teachings and advantages of the invention. Accordingly, all such modifications are intended to be included within the scope of the invention as defined in the claims. In the claims, means-plus-function clauses are intended to cover the structures described herein as performing the recited function and not only structural equivalents but also equivalent structures. Therefore, it is to be understood that the foregoing is illustrative of the invention and is not to be construed as limited to the specific example embodiments of the invention disclosed, and that modifications to the disclosed example embodiments, as well as other embodiments, are intended to be included within the scope of the appended claims. The invention is defined by the following claims, with equivalents of the claims to be included therein.

What is claimed is:

1. A method of forming a recessed gate electrode structure, the method comprising:
    etching a semiconductor substrate to form a first recess and a second recess in communication with the first recess, the second recess being larger than the first recess;
    forming a gate dielectric layer on a surface of the substrate and on an inner surface of the first and second recesses;
    forming a first preliminary polysilicon layer on the gate dielectric layer to fill the first and second recesses, the first preliminary polysilicon layer being doped with impurities at a fourth impurity density and defining a void therein;
    forming a second preliminary polysilicon layer on the first preliminary polysilicon layer, the second preliminary polysilicon layer being doped with the impurities at a fifth impurity density lower than the fourth impurity density; and
    performing a heat treatment to diffuse impurities contained within the first and second preliminary polysilicon layers to convert the first and second preliminary polysilicon layers into a first polysilicon layer in the first recess doped with the impurities at a first impurity density, a second polysilicon layer in the second recess doped with the impurities at a second impurity density higher than the first impurity density and a third polysilicon layer on the gate dielectric layer and the first polysilicon layer, the third polysilicon layer being doped with the impurities at a third impurity density lower than the first impurity density, wherein the impurities within the second polysilicon layer at the second impurity density substantially prevent migration of the void.

2. The method of claim 1, wherein the fourth impurity density is not less than the first impurity density and the fifth impurity density is lower than the third impurity density.

3. The method of claim 1, wherein the second preliminary polysilicon layer is formed in situ with the first preliminary polysilicon layer.

4. The method of claim 1, wherein the impurities doped into the second polysilicon layers include phosphorus (P), and the second impurity density ranges from about 3.5E20 atoms/cm$^3$ to about 5.0E20 atoms/cm$^3$.

5. The method of claim 1, further comprising forming a buffer layer on the gate dielectric layer along a surface of the substrate and the inner surface of the first and second recesses.

6. The method of claim 1, wherein the first polysilicon layer, the second polysilicon layer and the third polysilicon layer form a gate structure.

7. A method of forming a recessed gate electrode structure, the method comprising:

etching a surface of a semiconductor substrate to form a first recess and a second recess in communication with the first recess, the second recess being larger than the first recess;

forming a gate dielectric layer on the surface of the substrate and on an inner surface of the first and second recesses;

forming a first preliminary polysilicon layer on the gate dielectric layer to fill the first and second recesses and to overlap the surface of the semiconductor substrate, the first preliminary polysilicon layer being doped with impurities at a fourth impurity density and defining a void within the first and second recesses;

forming a second preliminary polysilicon layer on the first preliminary polysilicon layer, the second preliminary polysilicon layer being doped with the impurities at a fifth impurity density lower than the fourth impurity density; and diffusing the impurities contained within the first and second preliminary polysilicon layers by performing a heat treatment to convert a portion of the first preliminary polysilicon layer filling the first recess and a portion of the first preliminary polysilicon layer filling the second recess into a first polysilicon layer and a second polysilicon layer, respectively, and to convert the portion of the first preliminary polysilicon layer overlapping the surface of the semiconductor substrate and the second preliminary polysilicon layer into a third polysilicon layer, wherein the first polysilicon layer has a first impurity density not more than the fourth impurity density, the second polysilicon layer has a second impurity density higher than the first impurity density and the third polysilicon layer has a third impurity density higher than the fifth impurity density and lower than the first impurity density and wherein the impurities in the second polysilicon layer at the second impurity density substantially prevent migration of the void.

8. The method of claim 7, wherein the first and second preliminary polysilicon layers are converted into the first, second and third polysilicon layers at the same time.

\* \* \* \* \*